(12) United States Patent
Kobayashi

(10) Patent No.: US 6,812,080 B2
(45) Date of Patent: Nov. 2, 2004

(54) METHOD OF PRODUCING SEMICONDUCTOR DEVICE

(75) Inventor: Hirofumi Kobayashi, Shiojiri (JP)

(73) Assignee: Seiko Epson Corporation (JP)

( * ) Notice: Subject to any disclaimer, the term of this patent is extended or adjusted under 35 U.S.C. 154(b) by 193 days.

(21) Appl. No.: 10/117,689

(22) Filed: Apr. 5, 2002

(65) Prior Publication Data

US 2002/0151122 A1 Oct. 17, 2002

(30) Foreign Application Priority Data

Apr. 6, 2001 (JP) ........................................ 2001-108063
Mar. 7, 2002 (JP) ........................................ 2002-062577

(51) Int. Cl.[7] ............................................ H01L 21/337
(52) U.S. Cl. ...................... 438/196; 438/195; 438/199; 438/188; 438/721
(58) Field of Search .............................. 438/299, 303, 438/305, 306, 307, 663, 664, 657, 656

(56) References Cited

U.S. PATENT DOCUMENTS 5,925,931 A * 7/1999 Yamamoto .................. 257/737
6,025,267 A * 2/2000 Pey et al. .................... 438/656

FOREIGN PATENT DOCUMENTS

| JP | 06-021091 | 7/1992 |
| JP | 09-023003 | 7/1995 |
| JP | 09-223796 | 2/1996 |

* cited by examiner

*Primary Examiner*—David Nelms
*Assistant Examiner*—Renee R. Berry
(74) *Attorney, Agent, or Firm*—Harness, Dickey & Pierce, P.L.C.

(57) ABSTRACT

As shown in FIG. 1(*a*), a gate oxide film 12 is formed on an Si substrate 11. A polysilicon layer 13 is formed thereon. A natural oxide film 14 having an arbitrary thickness is formed on the polysilicon layer 13 after phosphorus is made to diffuse into the polysilicon layer 13 and before a resist layer is coated. Thus, as shown in FIG. 1(*b*), the natural oxide film 14 present on the polysilicon layer 13 is removed by DHF cleaning (cleaning with dilute HF). Thereafter, a resist layer 15 is coated onto the polysilicon layer 13, and is patterned. A polysilicon gate electrode G is formed by dry-etching using the resist layer 15 as a mask.

7 Claims, 2 Drawing Sheets

[FIG.1]
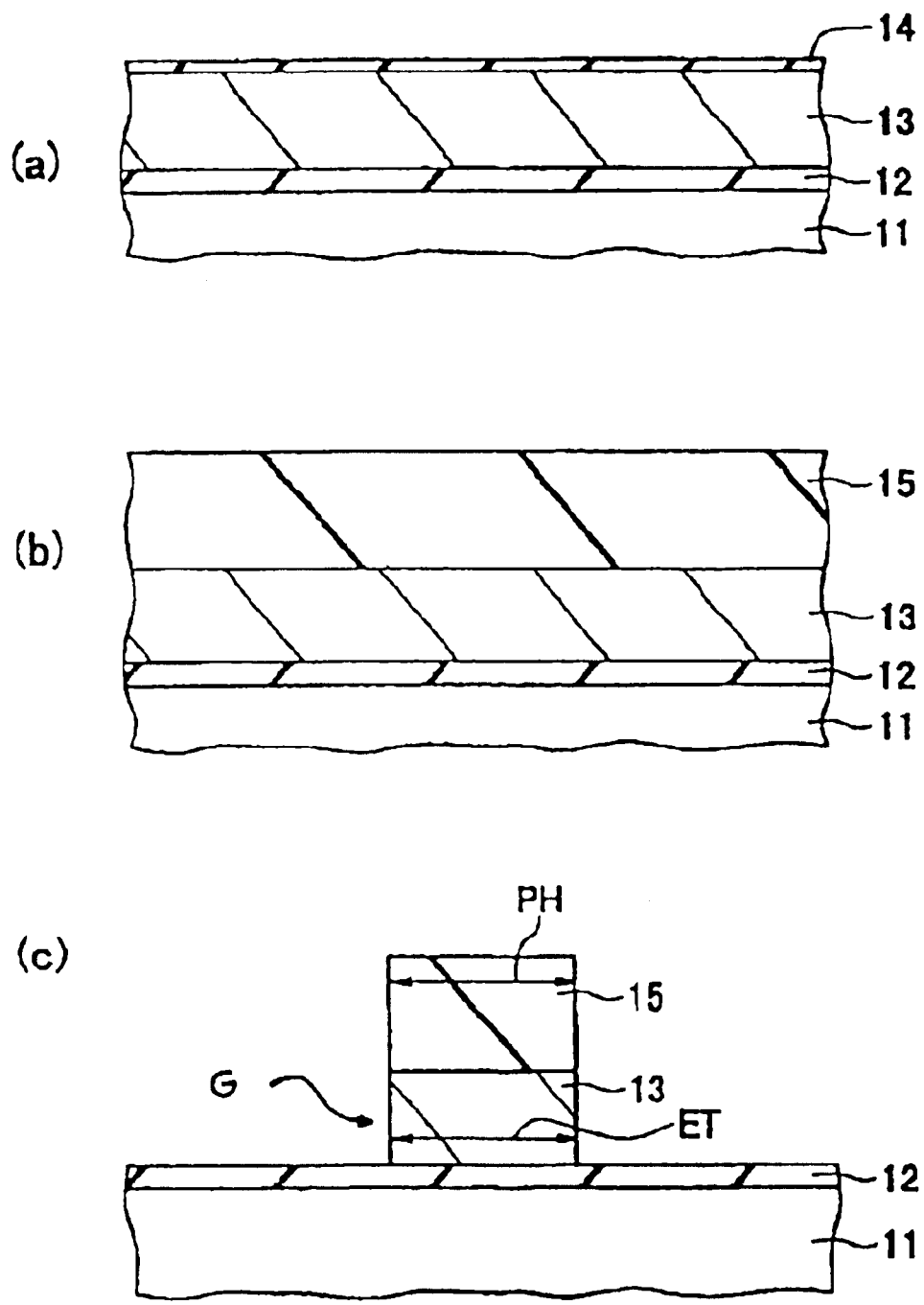

[FIG.2]
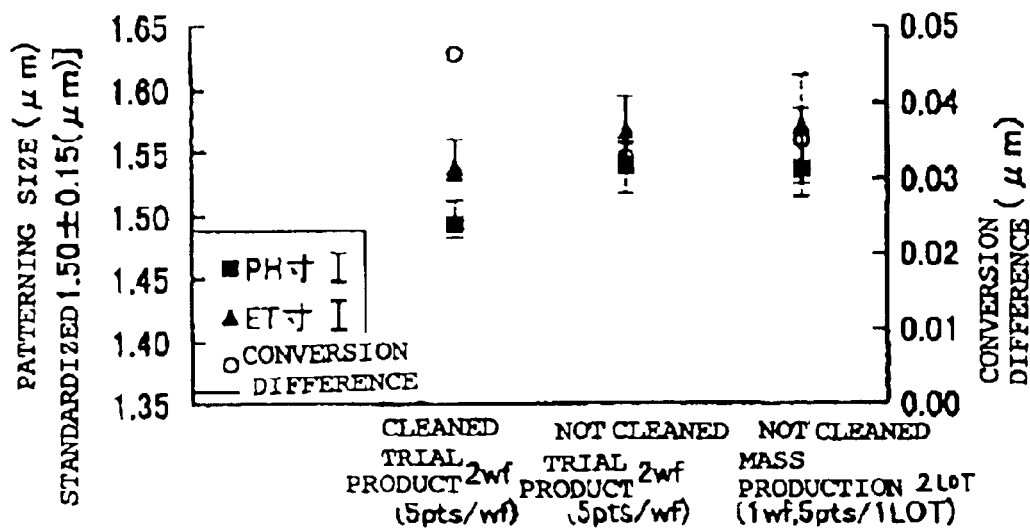
[FIG.3]
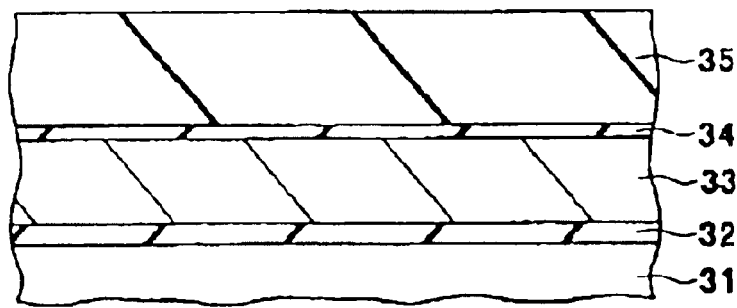

METHOD OF PRODUCING SEMICONDUCTOR DEVICE

TECHNICAL FIELD OF THE INVENTION

The present invention relates to production of a semiconductor device and, more particularly, to a method of producing a semiconductor device which requires a fine gate electrode.

DESCRIPTION OF THE RELATED ART

In recent years, large-scale integration of semiconductor devices and reduction of the design rules have remarkably progressed, and simultaneously, the gate electrodes of MOSFETS and the like have been required to have a fine size. A polysilicon layer is formed on an Si substrate via a gate oxide film, and the gate oxide film is patterned. In this case, the gate electrode is formed utilizing photolithography. The tolerance of dispersion in size has become more severe with the requirement for a so-called "half•micron" or "quarter•micron" size.

FIG. 3 is a cross-sectional view for illustrating patterning of a polysilicon gate electrode according to a conventional method of producing a semiconductor device. A polysilicon layer 33 is formed on an Si substrate 31 via a gate oxide film 32. A resist layer 35 for a photolithographic process is formed on the polysilicon layer 33. In this case, practically, a natural oxide film 34 is present on the polysilicon layer 33. Thus, the resist layer 35 is coated onto the natural oxide film 34 on the polysilicon layer 33, followed by patterning.

In the case in which the polysilicon layer is patterned by the photolithographic process while the natural oxide film is present on the polysilicon layer, the patterning size of the resist layer varies depending on the state of the natural oxide film. Thus, the etching size of the polysilicon after the processing also varies. After all, the dispersion in size of the gate electrode becomes remarkable. Thus, the dispersion may depart from a required tolerance in size of the gate electrode.

In view of the above-described situations, the present invention has been devised, and an object of the present invention is to provide a method of producing a semiconductor device by which the dispersion in size of the gate electrode can be reduced.

SUMMARY OF THE INVENTION

The method of producing a semiconductor device of the present invention which includes a process of patterning a gate electrode on a polysilicon layer formed on an Si wafer using photolithography is characterized in that the patterning process contains a process of removing a natural oxide layer formed on the polysilicon layer as a pre-treatment for coating a resist by the photolithography. Also, the method of producing a semiconductor device of the present invention is characterized in that the process of removing the natural oxide film uses fluorine or a fluorine-containing compound.

According to the method of producing a semiconductor device of the present invention, the natural oxide film having an arbitrary thickness formed on the polysilcon layer is removed before the resist is coated. Thereby, the uniform state on the whole surface of the polysilicon layer is obtained.

BRIEF DESCRIPTION OF THE DRAWINGS

FIGS. 1(a) to 1(c) consists of cross-sectional views which illustrate the patterning process for a polysilicon gate electrode in a method of producing a semiconductor device according to an embodiment of the present invention, respectively.

FIG. 2 is a characteristic graph illustrating the patterning of the polysilicon gate electrode in the method according to the embodiment of the present invention compared to the patterning of a conventional method.

FIG. 3 is a cross-sectional view which illustrates the patterning of a polysilicone gate electrode of the conventional method of producing a semiconductor device.

DETAILED DESCRIPTION OF THE PREFERRED EMBODIMENTS

FIGS. 1(a) to 1(c) illustrates in cross-sections the patterning process for a polysilicon gate electrode in a method of producing a semiconductor device according to an embodiment of the present invention. As shown in FIG. 1(a), a gate oxide ($SiO_2$) film 12 is formed on an Si substrate 11, and a polysilicon layer 13 is formed thereon. For example, the phospho-silicate glass not shown in the drawing is coated onto the polysilicon layer 13, and the diffusion of phosphorus is carried under the conditions of appropriate temperature and time. Thereafter, the phospho-silicate glass is removed, and the polysilicon layer 13 is subjected to APM cleaning (cleaning with a mixture of ammonium hydroxide, hydrogen peroxide, and water, that is, a mixed solution of $NH_4OH$ and $H_2O_2$), called SC-1 (Standard Cleaning Solution 1), so that particles, organic pollutants, and so forth on the wafer surface are removed therefrom. The SC-1 is a cleaning treatment carried out at about 60° C. A natural oxide film 14 having an arbitrary film thickness is formed on the whole surface of the polysilicon layer after the cleaning treatment and before the succeeding coating of a resist layer.

Thus, as shown in FIG. 1(b), the natural oxide film 14 present on the polysilicon layer 13 is removed by cleaning with DHF (dilute HF, that is, that comprising HF and $H_2O$ (at a ratio of 1:200 to 1:500). Thereafter, a resist layer 15 for photolithography is coated onto the polysilicon layer 13. In this embodiment, the DHF cleaning is employed to remove the natural oxide film 14. In addition, fluorine or fluorine-containing compounds may be used. Furthermore, phosphorus or phosphorus-containing compounds such as a $H_3PO_4$ aqueous solution or the like may be used.

Subsequently, as shown in FIG. 1(c), the resist layer 15 on the polysilicon layer 13 is patterned, and dry etching is carried out using the resist layer 15 as a mask, whereby a polysilicon gate electrode G is formed.

According to the method of the above-described embodiment, the natural oxide film 14 having an arbitrary thickness, formed on the polysilicon layer 13, is removed before the resist is coated. Thereby, the state of the whole surface of the polysilicon layer 13 becomes uniform before the resist is coated. Accordingly, influence of the state of the natural oxide film which may be exerted over the patterning size PH of the resist layer 15 and the size ET for etching of the polysilicon layer is eliminated. Thereby, the dispersion in size (ET) of the polysilicon gate electrode G is considerably reduced.

FIG. 2 is a characteristic graph illustrating the patterning of the polysilicon gate electrode carried out according to the method of the embodiment of the present invention compared to that of the conventional method. Regarding the patterning size, dispersions in the PH size which is the patterning size of the resist layer, and dispersions in ET size which is the polysilicon etching size of the gate electrode, measured at arbitrary five points per one wafer (% pts/wf), are shown in the graph. The conversion difference is the difference of the ET size to the PH size, and can be adjusted by control of light exposure.

According to the conventional technique, phospho-silicate glass is coated onto the polysilicon layer followed by diffusion of phosphorus, the phospho-silicate glass is removed, the SC-1 cleaning is carried out, and the resist layer is coated. Thus, cleaning is not carried out especially aiming at removing the natural oxide film, and the polysilicon gate electrode is patterned (measurement results with respect to the mass production are separately shown).

On the other hand, according to the method of the present invention, phospho-silicate glass is coated onto the polysilicon layer followed by diffusion of phosphorus, the phospho-silicate glass is removed, the SC-1 cleaning is carried out, the DHF cleaning is added, and the resist layer is coated. Thus, after the cleaning is carried out especially aiming at removing the natural oxide film, the polysilicone gate electrode is patterned.

Referring to the patterning size, it is seen that when the method of the present invention is employed, dispersions of both of the PH size and the ET size are sufficiently reduced compared to those by the conventional method. If the PH size can be stably controlled on the plane of the wafer, the conversion difference to the ET size can be controlled or adjusted by light exposure. Thus, the dispersions have no problems. Accordingly, this method makes a contribution to patterning of such a high precision polysilicon gate electrode as satisfies the severe requirement for a so-called "half micron" or "quarter micron" size.

As described above, according to the method of producing a semiconductor device of the present invention, the natural oxide film having an arbitrary thickness formed on the polysilicon layer is removed before the resist is coated. Thus, the state of the whole surface of the polysilicon layer becomes uniform. Accordingly, the patterning size of the resist layer in the photolithograpic process and the etching size of the polysilicon layer are not influenced with the state of the natural oxide film. Thus, dispersions can be considerably reduced. As a result, the method of producing a semiconductor device by which dispersion in size of a gate electrode can be reduced can be provided. The entire disclosures of Japanese Patent Nos. 2001-108063 filed Apr. 6, 2001, 2002-62577 filed Mar. 7, 2002 and 2002-089835 filed Mar. 27, 2002 are incorporated herein by reference.

What is claimed is:

1. A method of producing a semiconductor device which includes a process of patterning a gate electrode on a polysilicon layer formed on an Si wafer using photolithography, comprising:

cleaning the polysilicon layer removing particles and organic pollutants;

treating the polysilicon layer by removing a natural oxide layer formed on the polysilicon layer; and applying a resist layer to the as-treated polysilicon layer.

2. A method of producing a semiconductor device according to claim 1, wherein the process of removing the natural oxide film uses one of fluorine and a fluorine-containing compound.

3. A method comprising:

providing an Si wafer;

forming a polysilicon layer on the Si wafer;

photolithographically patterning a gate electrode on the polysilicon layer;

wherein said step of photolithographically patterning includes:

treating the polysilicon layer by removing a natural oxide layer formed on the polysilicon layer; and applying a resist layer to the as-treated polysilicon layer.

4. The method of claim 3 wherein said step of removing said natural oxide layer further comprises using one of fluorine and a fluorine-containing compound.

5. The method of claim 3 wherein said step of removing said natural oxide layer further comprises using one of phosphorus and a phosphorous containing compound.

6. The method of claim 3 wherein said step of removing said natural oxide layer further comprises using DHF.

7. The method of claim 6 wherein said DHF further comprises HF and $H_2O$ at a ratio of about 1:200 to about 1:500.

* * * * *